(12) United States Patent
Lee et al.

(10) Patent No.: US 8,757,088 B2
(45) Date of Patent: Jun. 24, 2014

(54) MASK FRAME ASSEMBLY

(75) Inventors: Choong-Ho Lee, Yongin (KR);
Jung-Min Lee, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 330 days.

(21) Appl. No.: 13/025,084

(22) Filed: Feb. 10, 2011

(65) Prior Publication Data
US 2011/0265714 A1 Nov. 3, 2011

(30) Foreign Application Priority Data
Apr. 29, 2010 (KR) .................. 10-2010-0040231

(51) Int. Cl.
*B05C 11/00* (2006.01)
*C23C 14/04* (2006.01)

(52) U.S. Cl.
CPC .............. *C23C 14/042* (2013.01); *C23C 14/04* (2013.01)
USPC ......................................................... 118/504

(58) Field of Classification Search
None
See application file for complete search history.

(56) References Cited

U.S. PATENT DOCUMENTS

| | | | | |
|---|---|---|---|---|
| 4,950,944 A | * | 8/1990 | Fujimura | 313/407 |
| 5,234,780 A | * | 8/1993 | Nitayama et al. | 430/5 |
| 5,968,686 A | * | 10/1999 | Yamada et al. | 430/5 |
| 6,858,086 B2 | | 2/2005 | Kang | |
| 2001/0004186 A1 | * | 6/2001 | Song et al. | 313/407 |
| 2004/0104197 A1 | * | 6/2004 | Shigemura et al. | 216/20 |
| 2008/0308214 A1 | | 12/2008 | Gervat et al. | |

FOREIGN PATENT DOCUMENTS

| | | |
|---|---|---|
| KR | 10-2001-0084081 A | 9/2001 |
| KR | 10-2003-0075221 A | 9/2003 |
| KR | 10-2006-0055097 A | 5/2006 |
| KR | 10-2007-0063307 A | 6/2007 |
| KR | 10-2008-0019030 A | 2/2008 |
| KR | 10-2008-0058602 A | 6/2008 |
| KR | 10-0941311 | 2/2010 |

OTHER PUBLICATIONS

Office action dated Feb. 17, 2012 issued in corresponding Korean Patent Application No. 10-2010-0040231, 3pp.
KIPO Office action dated May 1, 2012 for Korean applicaton No. 10-2010-0040231 (5 pages).

* cited by examiner

*Primary Examiner* — Dah-Wei D Yuan
*Assistant Examiner* — Jethro Pence
(74) *Attorney, Agent, or Firm* — Christie, Parker & Hale, LLP

(57) ABSTRACT

A mask frame assembly includes a frame, a mask having a deposition pattern and being installable on the frame in a state of being pulled by a first tension force in a first direction, and a tension force applying portion in the mask and configured to apply a second tension force in a second direction that is perpendicular or substantially perpendicular to the first direction.

11 Claims, 6 Drawing Sheets

MASK FRAME ASSEMBLY

CROSS-REFERENCE TO RELATED APPLICATION

This application claims the benefit of Korean Patent Application No. 10-2010-0040231, filed on Apr. 29, 2010, in the Korean Intellectual Property Office, the disclosure of which is incorporated herein in its entirety by reference.

BACKGROUND

1. Field

Aspects of embodiments of the present invention relate to a mask frame assembly used for deposition of a thin film.

2. Description of the Related Art

In general, an organic light emitting display exhibits a wide viewing angle, superior contrast, and fast response speeds. The organic light emitting display produces colors by injecting holes and electrons respectively in an anode and a cathode and combining the holes and electrons in a light-emitting layer. The organic light emitting display has a deposition structure in which the light-emitting layer is inserted between the anode and the cathode. However, since it is difficult to obtain a high efficiency light emission from the deposition structure, an intermediate layer, such as an electron injection layer, an electron transport layer, a hole transport layer, and a hole injection layer, between each electrode and the light-emitting layer needs to be selectively and additionally inserted.

The electrodes and the intermediate layer including the light-emitting layer of the organic light emitting display may be formed using a variety of methods, such as a deposition method, for example. To fabricate the organic light emitting display by using the deposition method, a fine metal mask (FMM) having the same pattern as that of a thin film to be formed on a substrate is aligned and the thin film having a desired pattern is formed by depositing a raw material for the thin film.

As the size of the FMM increases, an etching error in forming a thin film pattern increases and a sagging phenomenon at the center portion of the FMM due to the weight of the FMM itself becomes severe. To address this matter, a split mask, which is made by splitting a mask into a plurality of strips and then attaching the strips to a frame is preferred. Compared to a one-piece mask, the sagging phenomenon may occur in the split mask less severely. When attached to the frame, the split mask is welded to the frame by being tightly pulled in a lengthwise direction.

However, when the split mask is welded to the frame in a tension state as described above, although a tight tension force is applied to the split mask in a lengthwise direction in which the split mask is pulled, a contraction force is applied in a widthwise direction such that wrinkles in a wave form are generated in the split mask. In particular, as a mask is made thinner in order to reduce shadow that affects the thickness of a deposition film, the thickness of a mask is merely 20-40 μm and thus wrinkles are easily generated in the mask due to the contraction force in the widthwise direction. As such, when the wrinkles are generated, the mask is not closely attached to the substrate in some positions so that precise patterning may not be possible.

However, when the mask is attached directly to the frame without being pulled, it is not possible to form a precise pattern because of the mask sagging phenomenon described above. Therefore, a method of preventing or reducing generation of wrinkles when a mask is fixed to the frame by being tightly pulled in a lengthwise direction thereof is needed.

SUMMARY

According to aspects of embodiments of the present invention, a mask frame assembly is configured to prevent or reduce generation of wrinkles in a mask when the mask is fixed to a frame, by pulling a mask.

According to an embodiment of the present invention, a mask frame assembly includes a frame, a mask having a deposition pattern and being installable on the frame in a state of being pulled by a first tension force in a first direction, and a tension force applying portion in the mask and configured to apply a second tension force in a second direction that is perpendicular or substantially perpendicular to the first direction.

In one embodiment, the tension force applying portion includes a negative Poisson ratio member configured to apply the second tension force to the mask in the second direction when the first tension force is applied in the first direction.

The negative Poisson ratio member may be in a folded state before the first tension force is applied in the first direction, and may be in an unfolded state in the second direction after the first tension force is applied in the first direction.

The negative Poisson ratio member may be at a first end portion of the mask, and the mask frame assembly may further include another negative Poisson ratio member at a second end portion of the mask opposite the first end portion in the first direction.

In one embodiment, the tension force applying portion includes a spring configured to apply the second tension force to the mask in the second direction, and the second tension force is an elastic restoration force.

The spring may be between portions of the deposition pattern of the mask.

The spring may be a first spring, and the mask frame assembly may further include a second spring between the first spring and an end portion of the mask, the second spring being larger than the first spring.

The spring may be bent in a bow shape and fixed at opposite end portions to the mask. The end portions of the spring may be welded to the mask. The spring may include a thin metal plate.

The mask may include a plurality of split mask portions installed on the frame, and the first direction and the second direction are, respectively, a lengthwise direction and a widthwise direction of the mask. The split mask portions may be welded to the frame.

According to another embodiment of the present invention, a mask frame assembly includes a frame having an opening; and a mask coupled to the frame and including a deposition pattern at a location corresponding to the opening of the frame, the mask including a plurality of split mask portions attached to the frame in a state of being pulled by a first tension force in a first direction, wherein the split mask portions include tension force applying portions configured to apply a second tension force in a second direction that is perpendicular or substantially perpendicular to the first direction for maintaining the split mask portions in an unwrinkled state when the first tension force is applied.

In one embodiment, the tension force applying portions include a negative Poisson ratio member. In one embodiment, the tension force applying portions include a spring.

BRIEF DESCRIPTION OF THE DRAWINGS

The above and/or other features and aspects of embodiments of the present invention will become more apparent to and readily appreciated by those skilled in the art from the following description of some exemplary embodiments of the present invention, taken in conjunction with the accompanying drawings of which.

DETAILED DESCRIPTION

Figure 1:
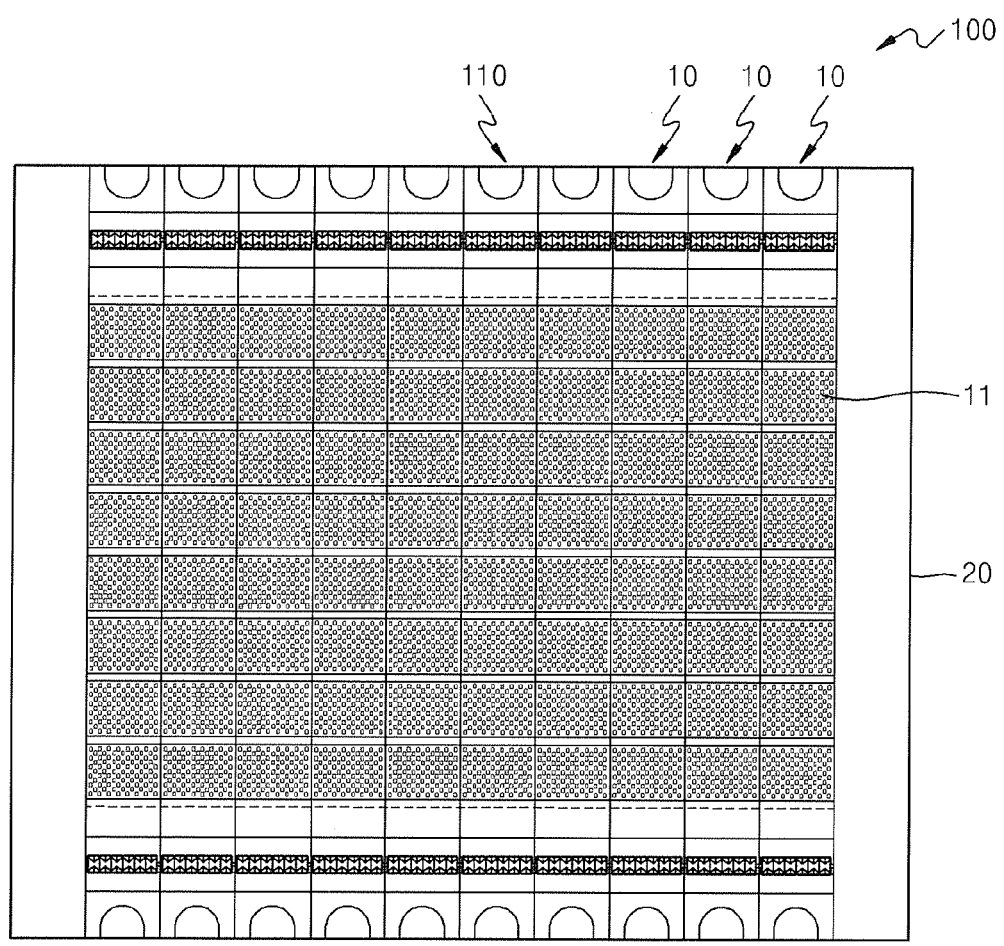
FIG. 1 is a plan view of a mask frame assembly according to an exemplary embodiment of the present invention.

Some exemplary embodiments will now be described more fully hereinafter with reference to the accompanying drawings, wherein like reference numerals refer to the like elements throughout. Embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art.

FIG. 1 is a plan view of a mask frame assembly 100 according to an exemplary embodiment of the present invention. Referring to FIG. 1, the mask frame assembly 100 according to one exemplary embodiment includes a frame 20 and a mask 110 including a plurality of split mask portions 10, each split mask portion 10 having both end portions fixed to the frame 20.

The frame 20 forms an outside frame of the mask frame assembly 100 and, in one embodiment, has a rectangular shape having an opening at the center thereof. In one embodiment, opposite end portions of each of the split mask portions 10 are fixedly welded to respective sides of a pair of sides of the frame 20 facing each other.

The split mask portions 10, in one embodiment, are members formed in strips, each including a deposition pattern 11 located corresponding to the opening of the frame 20. Further, in one embodiment, both, or opposite, end portions of the split mask portions 10 are welded to the frame 20. That is, in one embodiment, the mask 110 is manufactured as a plurality of split mask portions 10 (e.g., in strips), not as a single one-piece member, that are attached to the frame 20 to reduce a sagging phenomenon due to the weight of the mask 110 itself. The split mask portions 10 may be formed of, for example, nickel, a nickel alloy, a nickel-cobalt alloy, or any other suitable material or combination thereof, and the deposition pattern 11 may be formed in a photolithography process.

Figure 2:
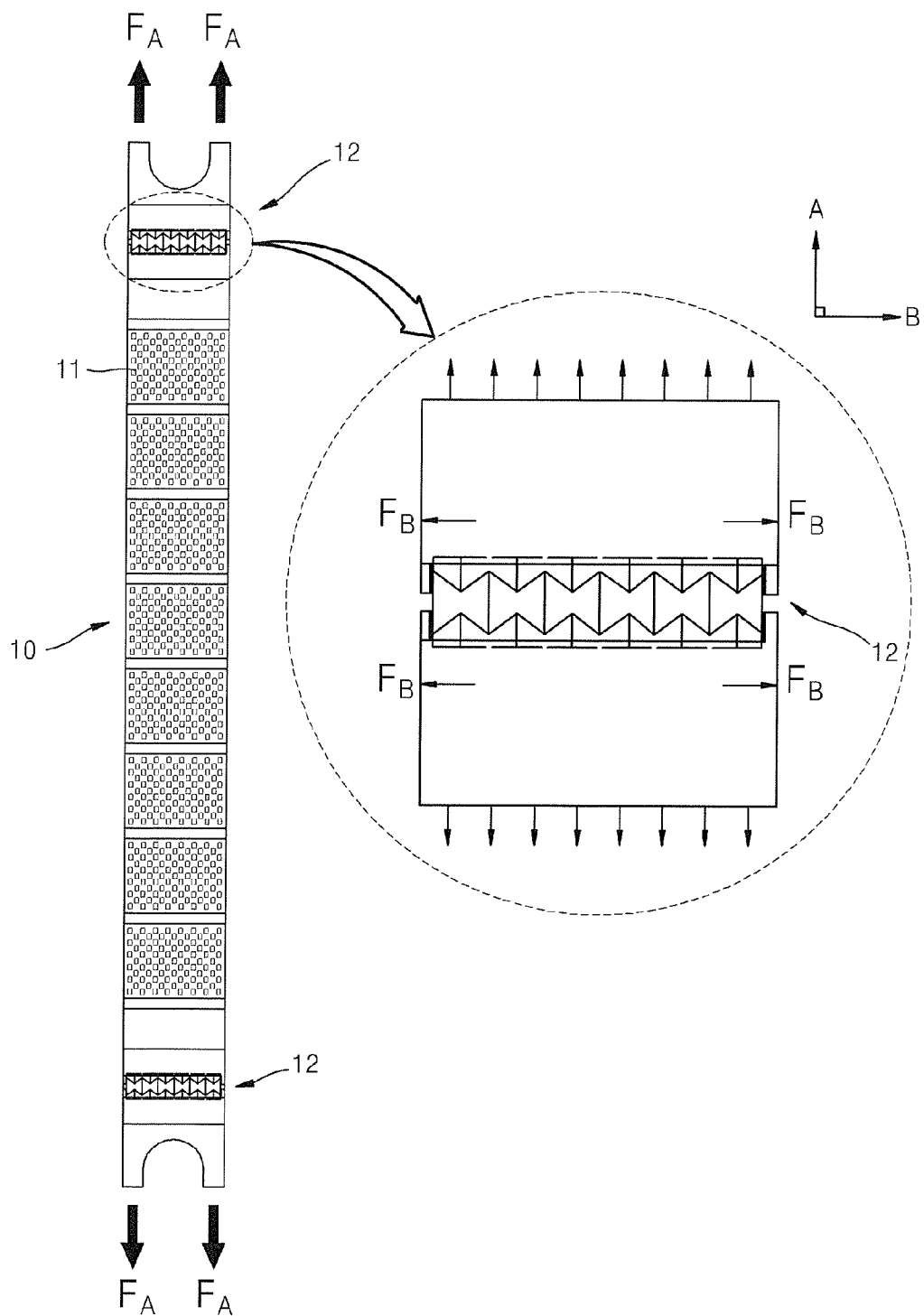
FIG. 2 is an enlarged view of a mask of the mask frame assembly of FIG. 1.

FIG. 2 is an enlarged view of one of the split mask portions 10 of the mask frame assembly 100 of FIG. 1. Referring to FIG. 2, a tension force applying portion 12 for applying a tension force $F_B$ in a widthwise direction B (hereinafter, referred to as the second direction B) that is perpendicular to a lengthwise direction A (hereinafter, referred to as the first direction A) is provided in both end portions of the split mask portions 10. When installed on the frame 20, the split mask portions 10 are fixed to the frame 20 in a state of being pulled in the first direction A (e.g., via a tension force $F_A$). As such, since the tension force applying portions 12 generate and apply the tension force $F_B$ to the split mask portions 10 in the second direction B, not only is the tension force $F_A$ applied to the split mask portions 10 in the lengthwise direction, but also, the tension force $F_B$ is applied to the split mask portions 10 in the widthwise direction. As a result, the wrinkle generation phenomenon is prevented or substantially prevented. By contrast, in a conventional mask which does not have the tension force applying portion 12, when the mask is pulled in the first direction A, contraction is generated in the second direction B and thus wrinkles are generated. However, in the split mask portion 10 according to an embodiment of the present invention, as the tension force applying portion 12 applies a tension force in the second direction B when the split mask portion 10 is pulled in the first direction A, the generation of wrinkles is prevented or substantially prevented.

Figure 3A:
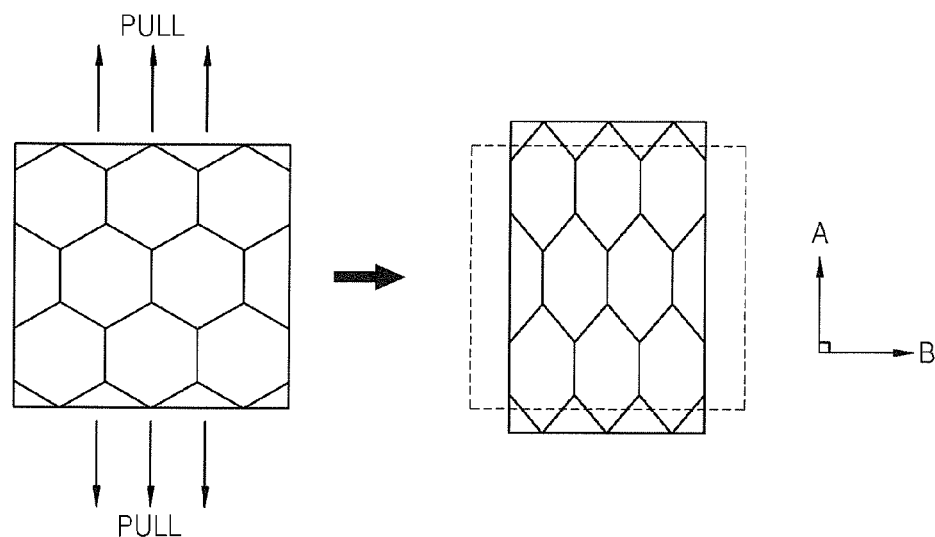
FIGS. 3A and 3B illustrate a comparison in properties between a positive Poisson ratio member and a negative Poisson ratio member.
Figure 3B:
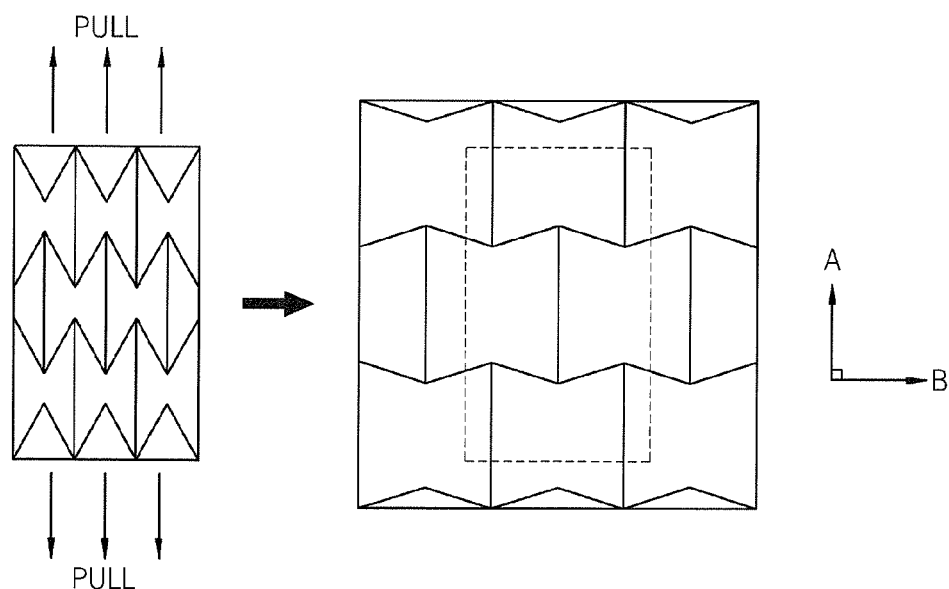

In one embodiment, the above-described tension force $F_B$ in the second direction B is applied because the tension force applying portion 12 is formed of a negative Poisson ratio member. In general, most structures have positive Poisson ratio properties as illustrated in FIG. 3A. That is, when a structure is pulled in the first direction A, the structure is contracted in the second direction B. However, in a negative Poisson ratio member, as illustrated in FIG. 3B, when a structure is pulled in the first direction A, a tension force, not a contraction force, is applied in the second direction B. In one embodiment, this is because the negative Poisson ratio member, which is maintained in a folded state, is unfolded in the second direction B and applies a tension force in the second direction B when a tension force is applied in the first direction A.

Figure 4A:
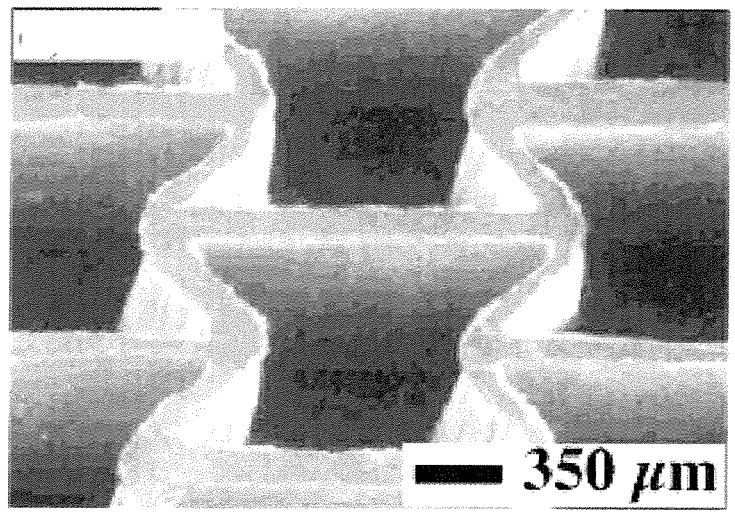
FIGS. 4A-4C are images showing various forms of the negative Poisson ratio member of FIG. 3B.
Figure 4B:
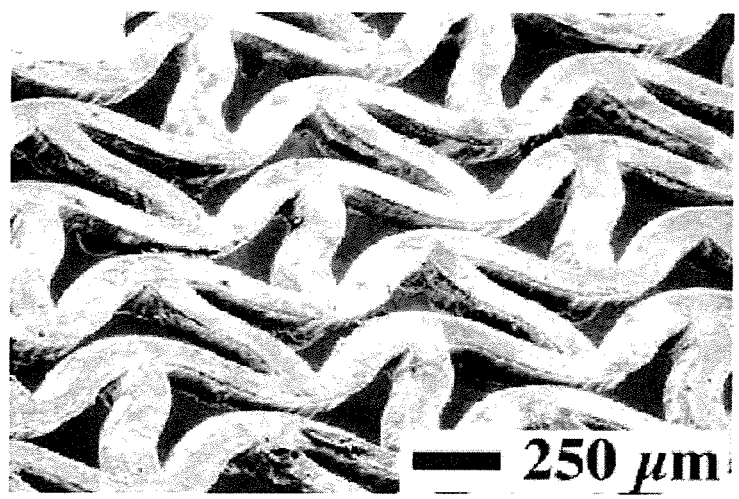
Figure 4C:
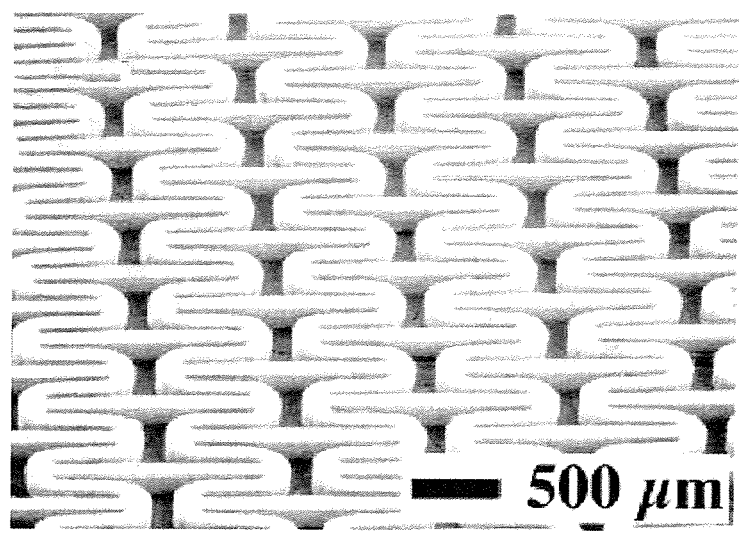

In embodiments of the present invention, the negative Poisson ratio member may be formed in a variety of shapes as illustrated in FIGS. 4A-4C. The negative Poisson ratio members in a folded state are unfolded in the second direction that is perpendicular to the first direction when a tension force is applied in the first direction. These shapes, in one embodiment, are patterned during a photolithography process of the deposition pattern 11 of the split mask portion 10. That is, when the deposition pattern 11 of the split mask portion 10 is formed by a photolithography process, the shape of a negative Poisson ratio member is patterned into the tension force applying portion 12 in both end portions of the split mask portion 10.

When the split mask portion 10 having the negative Poisson ratio member provided in both end portions of the split mask portion 10 as the tension force applying portion 12 is in use, the split mask portion 10 receives the tension force $F_B$ in the second direction B when the mask 10 is pulled in the first direction A to be fixed at the frame 20, and the split mask portion 10 is tightly pulled so that wrinkles are not generated or are substantially not generated. Thus, stable and finer patterning may be achieved in a deposition process by using the mask 110 including the negative Poisson ratio member.

Figure 5:
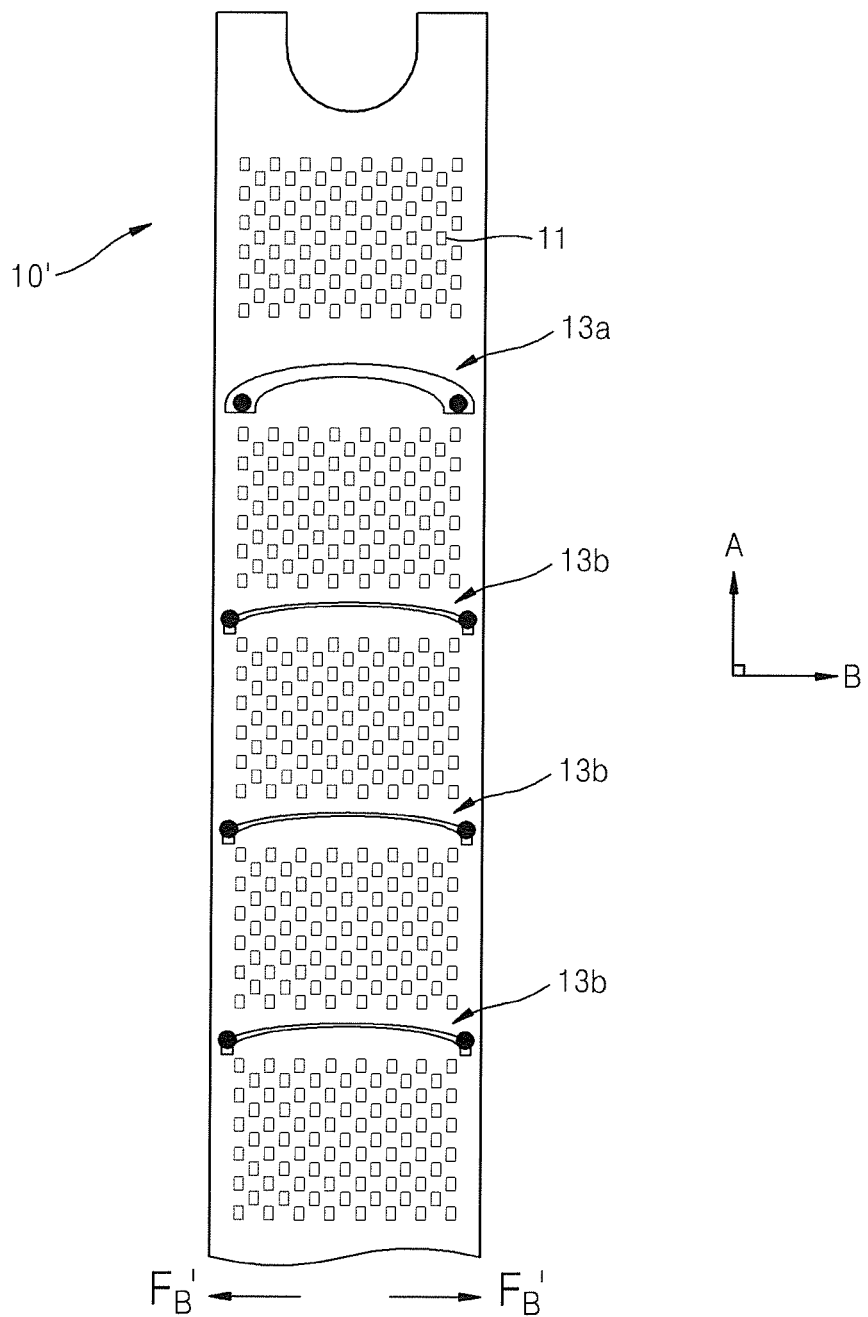
FIG. 5 is a partial plan view of a mask of a mask frame assembly according to another exemplary embodiment of the present invention.

With reference to FIG. 5, a split mask portion 10' according to another exemplary embodiment of the present invention includes tension force applying portions 13a and 13b. Referring to FIG. 5, springs are installed between neighboring deposition patterns 11 as the tension force applying portions 13a and 13b. The springs, in one embodiment, are thin metal plates bent in a bow shape and having both end portions of each spring fixedly welded to the split mask portion 10'. Accordingly, the springs apply a tension force $F_B'$ to the split mask portion 10' in the second direction B perpendicular to the first direction A, by an elastic restoration force thereof. In general, since a small force of about 0.1 N suffices to unfold wrinkles, the wrinkles may be prevented or substantially prevented from being generated by attaching one or more of the thin metal plate springs. The springs may be formed of, for example, nickel, a nickel alloy, a nickel-cobalt alloy, or any other suitable material or combination thereof.

In one embodiment, the spring of the tension force applying portion 13a is relatively larger than the springs of the tension force applying portions 13b, and is installed at the end portion of the split mask portion 10' where a tension force in the first direction A is most closely applied during pulling of the split mask portion 10'. The springs of the tension force applying portion 13b that are relatively smaller than the spring of the tension force applying portion 13a may be installed at a central portion of the split mask portion 10' away from the ends.

According to the above structure, since the elastic restoration forces of the tension force applying portions 13a and 13b are applied in the second direction B, when the split mask portion 10' is pulled in the first direction A, wrinkles are not generated or are substantially not generated. Thus, when a split mask portion having tension force applying portions according to the above-described embodiments is in use, wrinkles are prevented or substantially prevented from being generated during the assembly of the split mask portion and a frame, so that stable and precise patterning during deposition may be achieved.

Although in the above-described embodiments of the present invention, a split mask including a plurality of split mask portions is shown and described, embodiments of the present invention are not limited thereto. For example, in another embodiment of the present invention, a mask frame assembly may include a one-piece mask and a tension force applying portion for providing the above-described affect of preventing or reducing generation of wrinkles in the mask.

While this invention has been particularly shown and described with reference to some exemplary embodiments thereof, it will be understood by those of ordinary skill in the art that various changes in form and details may be made therein without departing from the spirit and scope of the invention as set forth in the appended claims.

What is claimed is:

1. A mask frame assembly for depositing a thin film on a substrate, the mask frame assembly comprising: a frame; a fine metal mask having a deposition pattern
   and being installable on the frame in a state of being pulled by a first tension force in a first direction; and
   a negative Poisson ratio member in the mask and configured to expand toward an outside of the mask in a second direction perpendicular to the first direction and apply a second tension force to the mask in the second direction when the first tension force is applied in the first direction.

2. The mask frame assembly of claim 1, wherein the negative Poisson ratio member is in a folded state before the first tension force is applied in the first direction, and is in an unfolded state in the second direction after the first tension force is applied in the first direction.

3. The mask frame assembly of claim 1, wherein the negative Poisson ratio member is at a first end portion of the mask, and the mask frame assembly further comprises another negative Poisson ratio member at a second end portion of the mask opposite the first end portion in the first direction.

4. A mask frame assembly for depositing a thin film on a substrate, the mask frame assembly comprising: a frame; a fine metal mask having a deposition pattern
   including a plurality of openings and being installable on the frame in a state of being pulled by a first tension force in a first direction; and
   a spring attached to the mask at first and second locations at opposite sides of the plurality of openings of the deposition pattern, and configured to apply a second tension force to the mask in a second direction that is perpendicular to the first direction, wherein the second tension force is an elastic restoration force.

5. The mask frame assembly of claim 4, wherein the spring is between portions of the deposition pattern of the mask.

6. The mask frame assembly of claim 5, wherein the spring is a first spring, and the mask frame assembly further comprises a second spring between the first spring and an end portion of the mask, the second spring being larger than the first spring.

7. The mask frame assembly of claim 4, wherein the spring is bent in a bow shape and fixed at opposite end portions to the mask.

8. The mask frame assembly of claim 7, wherein the end portions of the spring are welded to the mask.

9. The mask frame assembly of claim 4, wherein the spring comprises a thin metal plate.

10. The mask frame assembly of claim 1, wherein the mask comprises a plurality of split mask portions installed on the frame, and the first direction and the second direction are, respectively, a lengthwise direction and a widthwise direction of the mask.

11. The mask frame assembly of claim 10, wherein the split mask portions are welded to the frame.

* * * * *